United States Patent
Kim

(10) Patent No.: US 7,297,593 B2
(45) Date of Patent: Nov. 20, 2007

(54) METHOD OF MANUFACTURING A FLOATING GATE OF A FLASH MEMORY DEVICE

(75) Inventor: Jae Heon Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 52 days.

(21) Appl. No.: 11/434,414

(22) Filed: May 15, 2006

(65) Prior Publication Data

US 2006/0281261 A1    Dec. 14, 2006

(30) Foreign Application Priority Data

Jun. 13, 2005    (KR) .................. 10-2005-0050266

(51) Int. Cl.
*H01L 21/336*    (2006.01)
(52) U.S. Cl. ............... 438/257; 438/619; 438/421; 438/422; 257/E21.564; 257/E23.013
(58) Field of Classification Search ............... 438/257, 438/619, 421, 422; 257/E21.564, E23.013; 437/64, 65

See application file for complete search history.

(56) References Cited

U.S. PATENT DOCUMENTS 6,838,342 B1 *    1/2005    Ding .................. 438/257
2003/0082876 A1 *    5/2003    Mandelman et al. ....... 438/243

* cited by examiner

*Primary Examiner*—Matthew Smith
*Assistant Examiner*—Ankush K Singal
(74) *Attorney, Agent, or Firm*—Marshall, Gerstein & Borun LLP

(57) ABSTRACT

A method of forming a floating gate of a flash memory device wherein a hard mask nitride film is stripped using two or more etching steps. Accordingly, a seam can be prevented when depositing a floating gate polysilicon film. Furthermore, the floating gate polysilicon film may be blanket-etched to make rounded upper edge portions of the floating gate polysilicon film. In this way, a void can be prevented when depositing a control gate polysilicon.

13 Claims, 4 Drawing Sheets

METHOD OF MANUFACTURING A FLOATING GATE OF A FLASH MEMORY DEVICE

BACKGROUND FOR THE INVENTION

1. Field of the Invention

The invention relates to a method of fabricating a flash memory device and more particularly, to a method of forming a self-aligned floating gate of a flash memory device.

2. Discussion of Related Art

In NAND flash memory devices of 70 nm or less, if a floating gate polysilicon film is deposited after an Isolation Film (ISO) is formed and a floating gate is then formed with an etch process, a short circuit may occur between the ISO and the floating gate due to a short mask overlay margin of the floating gate polysilicon film. Also, a device driving failure may occur because the distance between the ISO and the floating gate is too small.

To avoid this disadvantage, a self-aligned floating gate formation method has been applied in which the floating gate polysilicon film and the ISO can be naturally self-aligned when forming an ISO pattern without using a mask process for the floating gate polysilicon film.

FIGS. 1A and 1B are cross-sectional views of the floating gate of a NAND flash memory device in the related art.

The thickness of a floating gate polysilicon film 16 is necessarily at least 500 Å to form a self-aligned floating gate. To maintain the thickness of the floating gate polysilicon film 16 at a value of at least 500 Å, the thickness of a hard mask nitride film (not shown) must be at least 1000 Å before etching the ISO, to accommodate a subsequent polysilicon Chemical Mechanical Polishing (CMP) process.

Furthermore, upon etching the ISO, an etch profile slope of the hard mask nitride film is not fully 90°. Accordingly, a CMP process is performed after a High Density Plasma (HDP) oxide film 14 is deposited within a trench. Thereafter, when the hard mask nitride film (not shown) is stripped by a wet etch process, the floating gate polysilicon film 16 that is subsequently deposited becomes a negative profile on the tunnel oxide film 12 on the silicon substrate 10, as shown in FIG. 1A, while the hard mask nitride film is stripped by a wet chemical process.

The negative profile of the floating gate polysilicon film 16 becomes exaggerated in the cleaning process and results in a seam or void upon polysilicon deposition. The seam or void is exposed as shown in FIG. 1B during the polysilicon CMP process, and the seam or void portion thus also affects subsequent deposition processes (e.g., the deposition of an oxide-nitride-oxide (ONO) film). Accordingly, a problem arises because materials deposited at the seam or void portion remain as residues when etching the device to form a floating gate module.

SUMMARY OF THE INVENTION

An embodiment of the present invention relates to a method of fabricating a flash memory device, which method can prevent seam formation when depositing a floating gate polysilicon film by stripping a hard mask nitride film using at least two wet chemical etching steps.

Another embodiment of the present invention relates to a method of fabricating a flash memory device, which method can prevent void formation when depositing a control gate polysilicon in such a manner that an upper edge portion of a floating gate polysilicon film is rounded by blanket-etching the floating gate polysilicon film.

A method of forming a floating gate of a flash memory device includes the steps of sequentially depositing a screen oxide film, a hard mask nitride film, a hard mask buffer oxide film, and a hard mask polysilicon film on a semiconductor substrate, and then performing a patterning process to expose the semiconductor substrate; etching the exposed semiconductor substrate to form trenches while removing the hard mask polysilicon film; depositing a high density plasma oxide film on the entire structure including the insides of trenches and then stripping the high density plasma oxide film and the hard mask buffer oxide film using the hard mask nitride film as an etch stopper; stripping the hard mask nitride film using at least two wet chemical etching steps; after stripping the screen oxide film, depositing a tunnel oxide film and then depositing a floating gate polysilicon film on the entire structure including the tunnel oxide film; and, partially removing the high density plasma oxide film within the trenches to create recessions therein, and then rounding the upper edges of the floating gate polysilicon film, which upper edges are exposed by the creation of the recessions.

BRIEF DESCRIPTION OF THE DRAWINGS

A more compete appreciation of the invention and many of the attendant advantages thereof will become readily apparent with reference to the following detailed description when considered in conjunction with the accompanying drawings, wherein.

DETAILED DESCRIPTION OF EMBODIMENTS

Figure 1A:
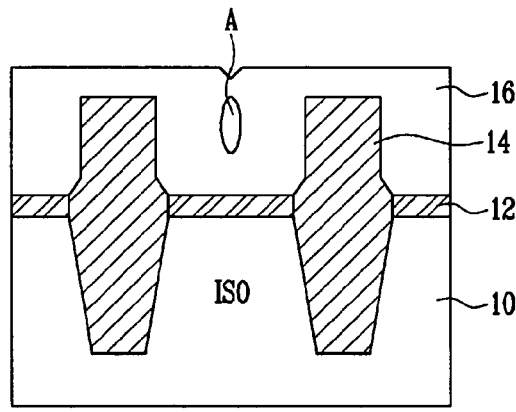
FIGS. 1A and 1B are cross-sectional views of the floating gate of a NAND flash memory device in the related art; and, FIGS. 2A to 2J are cross-sectional views illustrating a method of forming the floating gate of a flash memory device according to an embodiment of the present invention.
Figure 1B:
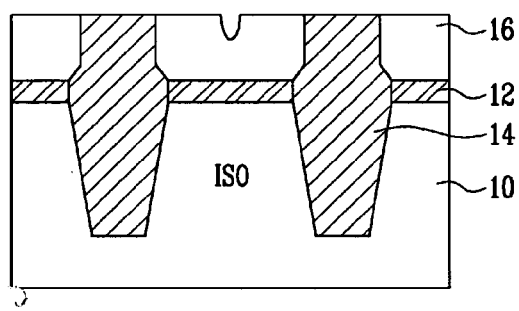

In this detailed description, only certain illustrative embodiments of the present invention are shown and described. As those skilled in the art will realize, the described embodiments may be modified in various ways, without departing from the spirit or scope of the present invention. Accordingly, the drawings and description are to be regarded as illustrative in nature and not restrictive. Like reference numerals designate like elements throughout.

FIGS. 2A to 2J are cross-sectional views illustrating a method of forming the floating gate of a flash memory device according to an embodiment of the present invention.

Figure 2A:
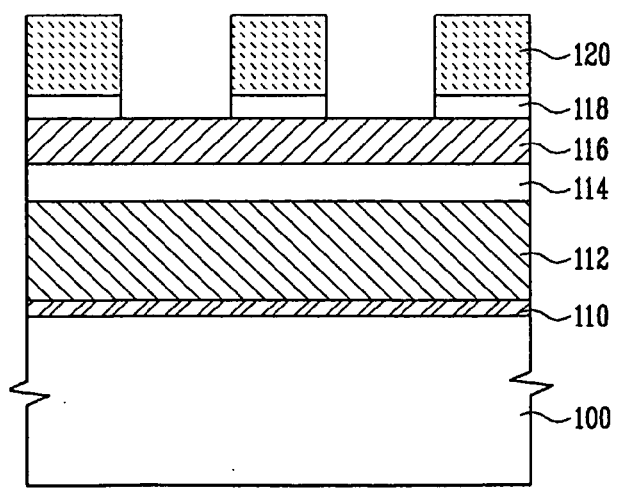

Referring to FIG. 2A, a screen oxide film 110, a hard mask nitride film 112, a hard mask buffer oxide film 114, hard mask polysilicon film 116, an anti-reflection film 118, and a photoresist pattern 120 are sequentially formed on a semiconductor substrate 100. The anti-reflection film 118 is etched using the photoresist pattern 120 as an etch mask. The hard mask films 112, 114, and 116 shown in FIG. 2A depict a three-layer hard mask method for etching the nitride film to a thickness of 1000 Å or more without creating defects on the top surface of the hard mask nitride film under an argon-fluorine (ArF) photoresist condition. Undoped amorphous polysilicon may be used as the hard mask polysilicon film 116.

Figure 2B:
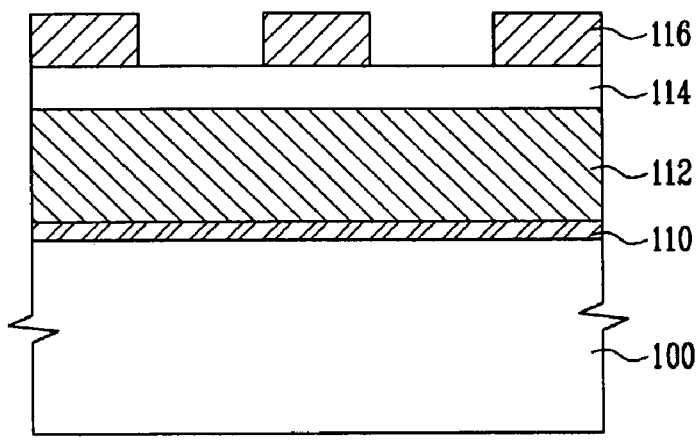

Referring to FIG. 2B, the hard mask polysilicon film 116 is etched using the photoresist pattern 120 as an etch mask. A combination of chlorine ($Cl_2$), hydrogen bromide (HBr), and oxygen ($O_2$) may be used as the etch gas for the hard mask polysilicon film. Furthermore, the photoresist has a high selectivity so that the top surface of the hard mask polysilicon film is not damaged, even though 50% or more of the hard mask polysilicon film is etched. After the hard mask polysilicon film is etched, the photoresist pattern 120 and the anti-reflection film 118 are stripped. A cleaning process is then performed.

Figure 2C:
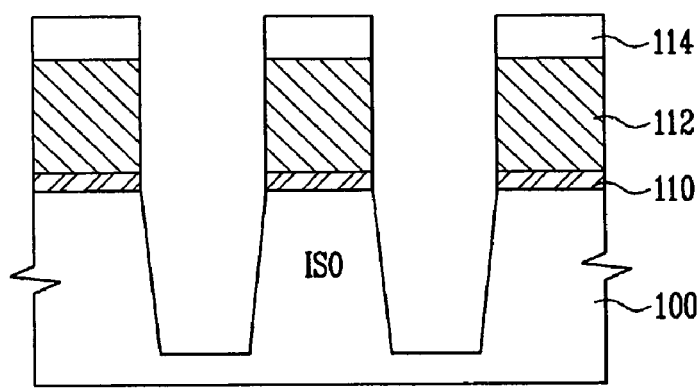

Referring to FIG. 2C, the hard mask buffer oxide film 114, the hard mask nitride film 112, and the screen oxide film 110 are sequentially etched using the hard mask polysilicon film 116 as an etch mask. The hard mask nitride film 112 is etched to create a slope angle for the hard mask nitride film 112 of at least 85° so that the critical dimension (CD) does not exceed 10 nm.

Thereafter, the exposed silicon substrate 100 is etched using the remaining hard mask polysilicon film 116 and the remaining hard mask buffer oxide film 114 as barriers, thereby forming trenches for forming the ISO. At this time, the trench profile angle is selected to be not more than 87° to facilitate subsequent filling of the trench. A combination of HBr and $O_2$ is used as the etch gas to maintain the trench profile angle of not more than 87°. When the semiconductor substrate 100 is etched to form the trenches, the hard mask polysilicon film 116 is also etched and stripped.

Figure 2D:
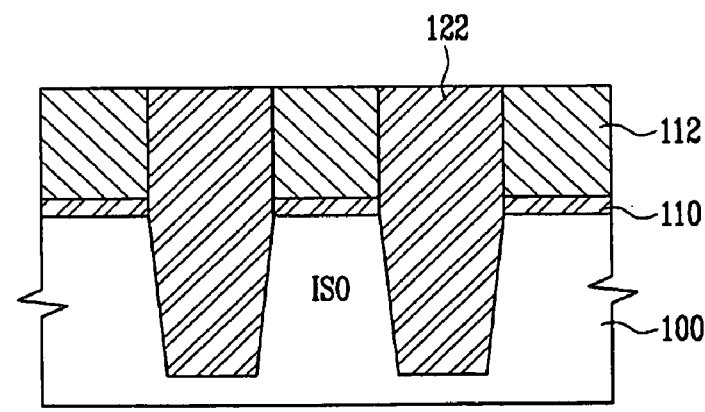

Referring to FIG. 2D, a HDP oxide film 122 is deposited on the entire structure, including the insides of the trenches. The HDP oxide film 122 is polished with a CMP process. Because the HDP oxide film 122 is polished using the hard mask nitride film 112 as an etch stopper, the hard mask buffer oxide film 114 is also stripped.

Figure 2E:
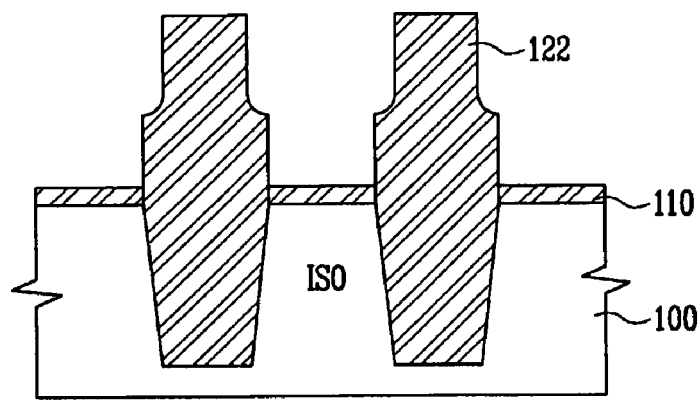
Figure 2F:
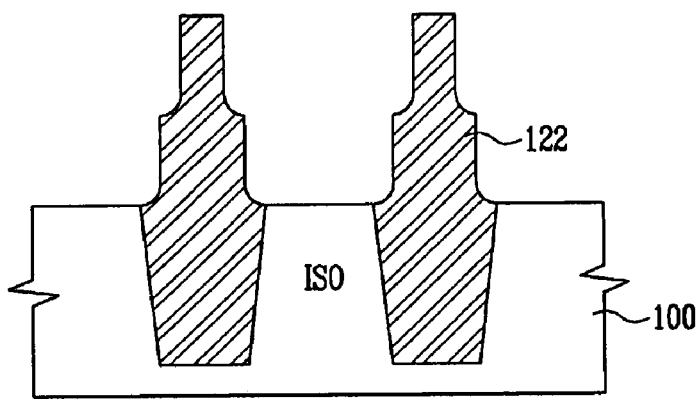

Referring to FIGS. 2E and 2F, the hard mask nitride film 112 is stripped using at least two wet chemical etching steps. Specifically, the hard mask nitride film 112 is first etched using an ammonium fluoride ($NH_4F$) and hydrogen fluoride (HF) chemical solution, and is secondly etched using a phosphoric acid ($H_3PO_4$) chemical solution. These etch processes are repeatedly performed to strip the hard mask nitride film 112. The hard mask nitride film 112 is stripped multiple times to create an upper space in which the floating gate polysilicon film will be filled.

As described above, if the hard mask nitride film 112 is stripped using at least two wet chemical etching steps as shown in FIG. 2F, a seam is not generated after the floating gate polysilicon film is deposited.

Figure 2G:
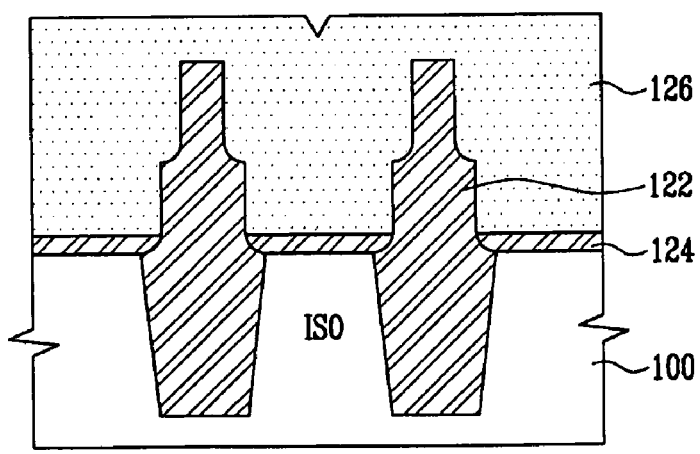
Figure 2H:
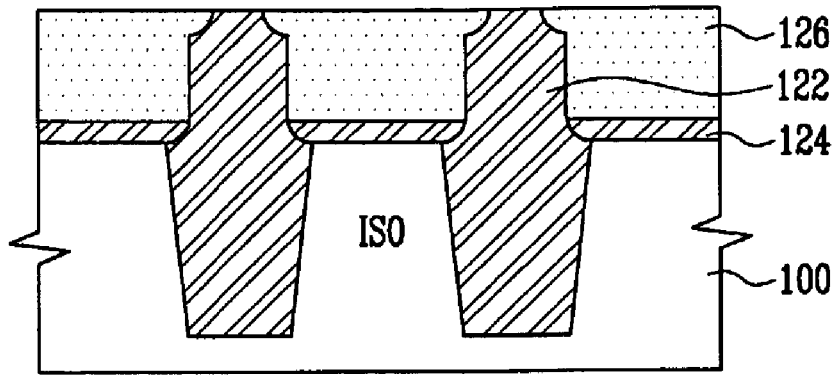

Referring to FIGS. 2G and 2H, after the screen oxide film 110 is stripped, the space in which the floating gate will be formed is widened with a pre-cleaning step. Thereafter, a tunnel oxide film 124 is deposited on the exposed semiconductor substrate 100. After a floating gate polysilicon film 126 is deposited on the entire structure, the entire surface is polished with a CMP process as shown in FIG. 2H.

Figure 2I:
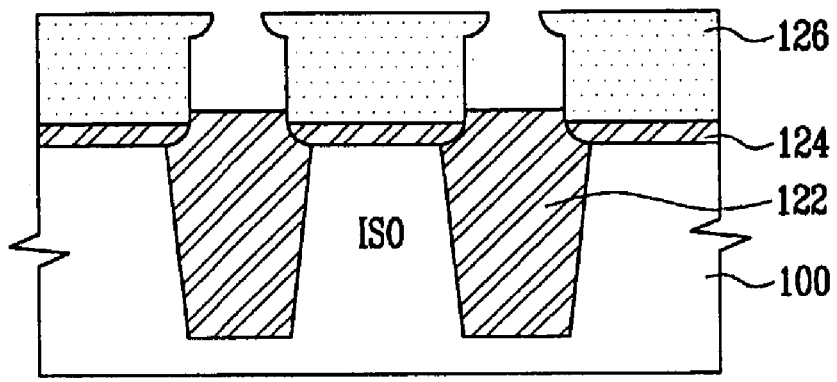

Referring to FIG. 2I, the HDP oxide film 122 is partially removed using a dry etch gas to create a recession. At this time, the loss of the HDP oxide film 122 can be minimized using a dry etch gas having a high polysilicon selectivity against the HDP oxide film 122.

Figure 2J:
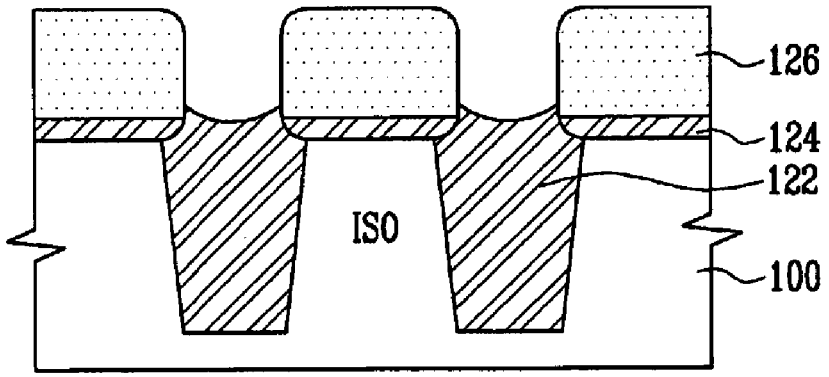

Referring to FIG. 2J, the upper edges of the floating gate polysilicon film 126 are rounded with a blanket etch step to secure a positive space for depositing a control gate polysilicon (not shown). When the floating gate polysilicon film 126 is blanket-etched, a combination of HBr, $Cl_2$, and $O_2$ may be used as the etch gas. With respect to the etch selectivity, a high polysilicon etch selectivity against the oxide film 122, is maintained (i.e., the selectivity ratio of HDP oxide film:polysilicon is 1:5 or more).

In the blanket etch step, the upper edges of the floating gate polysilicon film 126 are etched with a chemical sputtering process having an enhanced sputtering characteristic rather than a chemical characteristic. It is therefore possible to minimize the loss of the upper edges of the floating gate polysilicon film 126. Furthermore, a reduction in the coupling ratio between the floating gate and the control gate can be minimized by first etching only the upper edges of the floating gate polysilicon film 126.

If the upper edges of the control gate polysilicon are rounded as described above, a void is not generated when the control gate polysilicon is deposited.

As described above, according to an embodiment of the present invention, although the thickness of the floating gate polysilicon film is at least 500 Å or more when manufacturing devices of 70 nm or less, seam formation can be prevented when depositing the floating gate polysilicon film. It is also possible to prevent void formation when depositing the control gate polysilicon.

As a result, since the thickness of the floating gate polysilicon film polysilicon film can be maintained at 500 Å or more, the area in which an ONO dielectric film will be formed can be increased.

While the invention has been described in connection with what is presently considered to be practical illustrative embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a floating gate of a flash memory device, the method comprising the steps of:

sequentially depositing a screen oxide film, a hard mask nitride film, a hard mask buffer oxide film, and a hard mask polysilicon film on a semiconductor substrate and then performing a patterning process to expose the semiconductor substrate;

etching the exposed semiconductor substrate to form trenches while removing the hard mask polysilicon film;

depositing a high density plasma oxide film on the entire structure including the insides of the trenches and then stripping the high density plasma oxide film and the hard mask buffer oxide film using the hard mask nitride film as an etch stopper;

stripping the hard mask nitride film using at least two wet chemical etching steps;

after stripping the screen oxide film, depositing a tunnel oxide film and then depositing a floating gate polysilicon film on the entire structure including the tunnel oxide film; and, partially removing the high density plasma oxide film within the trenches to create recessions therein, and then rounding the upper edges of the floating gate polysilicon film, which upper edges are exposed by the creation of the recessions.

2. The method of claim 1, further comprising the step of performing pre-cleaning after stripping the screen oxide film.

3. The method of claim 1, comprising depositing the hard mask nitride film to a thickness of 1000 Å.

4. The method of claim 1, wherein the hard mask polysilicon film comprises undoped amorphous polysilicon.

5. The method of claim 1, comprising using a mixture of chlorine, hydrogen bromide, and oxygen as as an etch gas for the hard mask polysilicon film.

6. The method of claim 1, comprising etching the hard mask nitride film to create a slope angle for the hard mask nitride film of at least 85°.

7. The method of claim 1, comprising forming the trenches with a trench profile angle of not more than 87°.

8. The method of claim 1, comprising forming the trenches by etching the semiconductor substrate using a mixture of hydrogen bromide and oxygen as an etch gas.

9. The method of claim 1, comprising etching the hard mask nitride film first using an ammonium fluoride/hydrogen fluoride chemical solution and secondly using a phosphoric acid chemical solution.

10. The method of claim 1, comprising blanket etching the upper edges of the floating gate polysilicon film.

11. The method of claim 1, comprising etching the upper edges of the floating gate polysilicon film, using a mixture of chlorine, hydrogen bromide, and oxygen as an etch gas.

12. The method of claim 1, wherein the selectivity ratio of the high density plasma oxide film:polysilicon film is at least 1:5 when etching the upper edges of the floating gate polysilicon film.

13. The method of claim 1, comprising etching the upper edges of the floating gate polysilicon film with a chemical sputtering process having an enhanced sputtering characteristic.

* * * * *